(12) United States Patent
Sugahara et al.

(10) Patent No.: US 9,822,486 B2
(45) Date of Patent: Nov. 21, 2017

(54) FLAME-RESISTANT PAPER FOR WAVE ABSORBER MEMBER AND WAVE ABSORBER MEMBER

(71) Applicant: Toray Industries, Inc., Tokyo (JP)

(72) Inventors: Toru Sugahara, Otsu (JP); Takashi Tanoue, Otsu (JP)

(73) Assignee: Toray Industries, Inc. (JP)

( * ) Notice: Subject to any disclaimer, the term of this patent is extended or adjusted under 35 U.S.C. 154(b) by 234 days.

(21) Appl. No.: 14/649,133

(22) PCT Filed: Dec. 4, 2013

(86) PCT No.: PCT/JP2013/082532
§ 371 (c)(1),
(2) Date: Jun. 2, 2015

(87) PCT Pub. No.: WO2014/088019
PCT Pub. Date: Jun. 12, 2014

(65) Prior Publication Data
US 2016/0208438 A1 Jul. 21, 2016

(30) Foreign Application Priority Data
Dec. 5, 2012 (JP) .................. 2012-266221

(51) Int. Cl.
| | |
|---|---|
| *D21H 21/34* | (2006.01) |
| *D21H 17/05* | (2006.01) |
| *D21H 17/67* | (2006.01) |
| *G01R 29/10* | (2006.01) |
| *H01Q 17/00* | (2006.01) |
| *D21H 17/63* | (2006.01) |
| *H05K 9/00* | (2006.01) |

(Continued)

(52) U.S. Cl.
CPC ........... *D21H 5/0002* (2013.01); *D21H 17/05* (2013.01); *D21H 17/63* (2013.01); *D21H 17/675* (2013.01); *D21H 21/34* (2013.01); *G01R 29/105* (2013.01); *H01Q 17/00* (2013.01); *H05K 9/0083* (2013.01); *D21H 21/14* (2013.01); *D21H 23/10* (2013.01); *H05K 9/00* (2013.01); *H05K 9/0003* (2013.01); *Y10T 428/24694* (2015.01)

(58) Field of Classification Search
CPC .......... Y10T 428/24694; D21H 5/0002; D21H 23/10; D21H 21/34; D21H 21/14; D21H 17/675; D21H 17/05; H05K 9/00; H05K 9/03; H01Q 17/00
See application file for complete search history.

(56) References Cited

U.S. PATENT DOCUMENTS

2009/0068437 A1* 3/2009 Miyagoshi ............. D21H 13/08
428/314.4

FOREIGN PATENT DOCUMENTS

| | | |
|---|---|---|
| JP | 2005-311332 A | 11/2005 |
| JP | 2008-141190 A | 6/2008 |
| JP | 2009-194341 A | 8/2009 |

(Continued)

*Primary Examiner* — Donald J Loney
(74) *Attorney, Agent, or Firm* — DLA Piper LLP (US)

(57) ABSTRACT

Flame-resistant paper for radio wave absorber members includes 40 to 70% by mass of pulp; 5 to 50% by mass of aluminum hydroxide powder; and 3 to 15% by mass of a flame retardant consisting of a polyborate, wherein the flame retardant consisting of a polyborate is contained in an amount of 7 to 25% by mass relative to the amount of the pulp.

16 Claims, 5 Drawing Sheets

(51) Int. Cl.
    *D21H 21/14*   (2006.01)
    *D21H 23/10*   (2006.01)

(56) References Cited

FOREIGN PATENT DOCUMENTS

| | | | |
|---|---|---|---|
| JP | 2011-111680 A | 6/2011 | |
| JP | 2011-214200 A | 10/2011 | |

* cited by examiner (A)  (B)  (C)

FLAME-RESISTANT PAPER FOR WAVE ABSORBER MEMBER AND WAVE ABSORBER MEMBER

TECHNICAL FIELD

This disclosure relates to flame-resistant paper used as a radio wave absorber member used in anechoic chambers and also to reduce radio wave hindrance, for example, in a wireless communication system, and a radio wave absorber member including the same.

BACKGROUND

Radio wave absorbers have been used in anechoic chambers, facilities to evaluate radio noise from various electronic devices and communication devices and to check if radio waves cause a malfunction, and recently used to reduce radio wave hindrance, e.g., radio wave interference, in wireless communication systems such as an electronic toll collection (ETC) system, a wireless LAN system, and a radio-frequency identification (RFID) system.

Such radio wave absorbers absorb radio waves by converting radio energy into heat energy, and thus may be burned when irradiated with high-energy radio waves. Therefore, absorbers used particularly in anechoic chambers require flame resistance. Radio wave absorbers used in other applications are also required to have flame resistance to secure the safety from fire and the like.

In addition, such radio wave absorbers are required to be lightweight from the standpoint of handleability (processability), and further required to have high rigidity so that there is no breakage or deformation which may reduce their radio wave absorbency.

Furthermore, radio wave absorbers used in anechoic chambers, which are used for as long as 10 years or more, are also required not to undergo discoloration or reduction in flame resistance during the time period.

As a radio wave absorber that satisfies the requirements described above, JP 2005-311332 A discloses a radio wave absorber having a hollow three-dimensional structure obtained by fabricating a sheet material having flame resistance into a corrugated cardboard structure and assembling the corrugated cardboard structure. The sheet material constituting this radio wave absorber, however, requires large amounts of inorganic components (in particular, inorganic powder) to achieve the desired flame resistance. As a result, the sheet material has a low tensile strength, and even when the sheet material is fabricated into a corrugated cardboard structure, the corrugated cardboard structure is not provided with a rigidity sufficient to withstand the impact during conveyance, during construction, or after construction, and may be deformed or broken. To improve rigidity, it is necessary to increase the basis weight of the sheet material, i.e., increase the amount of raw materials used for the sheet material, which may result in increase in mass of an absorber and increase in cost. Furthermore, there are also processing problems: for example, when the sheet material is processed into a corrugated cardboard structure, the sheet material, because of its low tensile strength, may be broken under the pressure or tension of processing equipment, and the processing speed cannot be increased to prevent such poor processing, leading to increase in processing cost.

JP 2009-194341 A discloses electromagnetic wave suppressing paper obtained by impregnating base paper containing wood pulp and carbon fibers with a guanidine flame retardant such as guanidine phosphate. That composition in which large amounts of inorganic components are not used as a flame retardant can provide a sheet material with a tensile strength. However, flame retardants for cellulose, including guanidine flame retardants, may cause discoloration of wood pulp in base paper, or may be detached in a high-humidity environment to result in reduced flame resistance.

It could therefore be helpful to provide highly processable flame-resistant paper for radio wave absorber members which has a high tensile strength, a moderate rigidity, and a high flame resistance, which properties are preferred for radio wave absorber members, undergoes no discoloration such as yellowing after long-term use, and maintains its high flame resistance even in a high-humidity environment; and a radio wave absorbing member with high rigidity and excellent handleability including the same.

SUMMARY

We thus provide a flame-resistant paper for radio wave absorber members comprising 40 to 70% by mass of pulp, 5 to 50% by mass of aluminum hydroxide powder, and 3 to 15% by mass of a flame retardant composed of the polyborate, and the flame retardant composed of the polyborate is contained in an amount of 7 to 25% by mass relative to the amount of the pulp.

Furthermore, the radio wave absorber member is a corrugated cardboard structure including the above-described flame-resistant paper for radio wave absorber members as a corrugated medium and/or liners, wherein the corrugated medium and/or the liners contain a conductive material, and the corrugated cardboard structure has a bending strength of 15 N or more.

We provide highly processable flame-resistant paper for radio wave absorber members which has a high tensile strength, a moderate rigidity, and a high flame resistance, undergoes no discoloration such as yellowing after long-term use, and maintains its high flame resistance even in a high-humidity environment; and a radio wave absorbing member with high rigidity and excellent handleability including the same.

DESCRIPTION OF SYMBOLS

Figure 1:
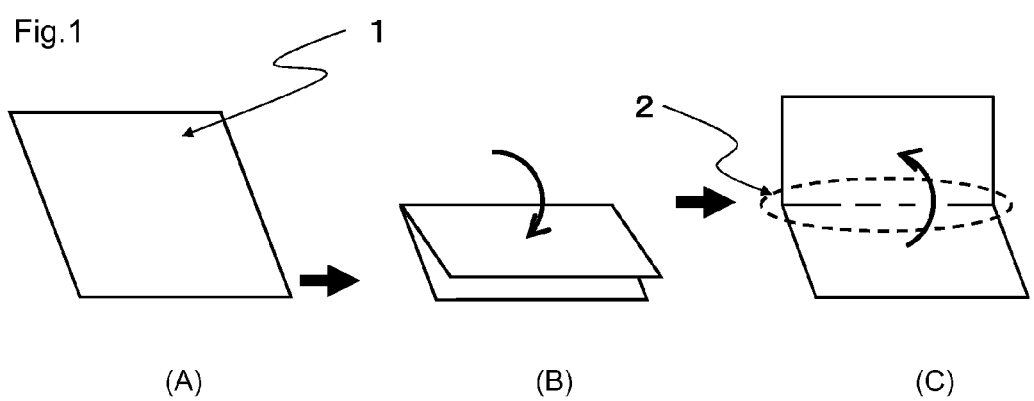
FIG. 1 is a schematic view of a folding process of flame-resistant paper for radio wave absorber members.

1: Flame-resistant paper for radio wave absorber members
2: Folded part
3: Fold
4: Continuous crack
5: Discontinuous crack
6: Discontinuous fold 7: Fixture for measuring a bending strength of a corrugated cardboard structure
8: Pressurizing bar
9: Supporting bar
10: Corrugated cardboard structure
11: Pressure direction

DETAILED DESCRIPTION

Examples of our flame-resistant paper will now be described.

The flame-resistant paper for radio wave absorber members comprises 40 to 70% by mass of pulp, 5 to 50% by mass of aluminum hydroxide powder, and 3 to 15% by mass of a flame retardant composed of the polyborate, based on 100% by mass of the total mass of materials of the flame-resistant paper for radio wave absorber members, and the flame retardant composed of the polyborate is 7 to 25% by mass relative to the amount of the pulp.

Examples of the pulp used for the flame-resistant paper for radio wave absorber members include plant fiber pulps such as softwood pulp, hardwood pulp, thermomechanical pulp, groundwood pulp, linter pulp, and hemp pulp; regenerated fiber pulps such as rayon; and synthetic fiber pulps such as vinylon and polyester. Of these, softwood pulp and hardwood pulp, which can impart a sufficient tensile strength and a sufficient rigidity to flame-resistant paper and a corrugated cardboard structure and, in addition, are inexpensive, are preferably used.

The flame-resistant paper for radio wave absorber members needs to contain pulp in the above amount. If the amount of the pulp is too small, the flame-resistant paper for radio wave absorber members cannot be provided with a sufficient tensile strength, which leads to tearing during fabrication into, for example, a corrugated cardboard structure, resulting in difficulty in stable manufacturing. In addition, the flame-resistant paper for radio wave absorber members will have a reduced stiffness and, therefore, the corrugated cardboard structure cannot be provided with a sufficient bending strength. As a result, when formed into a hollow three-dimensional shape, which is an often-used form of a radio wave absorber for anechoic chambers including a corrugated cardboard structure, the corrugated cardboard structure is more likely to be deformed or broken, for example, by contact during construction or use. If the amount of the pulp is too large, it is difficult to achieve the flame resistance of UL94 V-0 (described later). In addition, since pulp gradually turns yellow over time, the pulp in large amounts makes conspicuous discoloration of the flame-resistant paper itself, which is not preferred. Furthermore, the flame retardant composed of the polyborate used in the flame-resistant paper for radio wave absorber members has a property of hardening pulp and, therefore, if the amount of the pulp is large, the flame-resistant paper for radio wave absorber members tends to harden to result in poor processability. For example, the flame-resistant paper for radio wave absorber members may be torn during post-processing such as processing into a corrugated cardboard and printing. A more preferred amount of the pulp is not more than 60% by mass. In this range, a rigidity and a tensile strength suitable for fabrication can be provided, and a radio wave absorber member with a sufficient bending strength can be provided.

Next, the flame-resistant paper for radio wave absorber members needs to contain aluminum hydroxide powder in an amount of 5 to 50% by mass. Aluminum hydroxide, which contains crystal water in its white powder molecule, is dehydrated when heated at a high temperature, and the heat absorption at this time produces a flame-retardant effect. This flame-retardant effect does not decrease over time but is maintained for a long period of time. In addition, when used in a radio wave absorber for an anechoic chamber, aluminum hydroxide can enhance the lighting effect in the chamber because of its whiteness. Furthermore, although pulp generally turns yellow gradually over time, aluminum hydroxide does not undergo discoloration and can keep its whiteness. Through appropriate addition of conventional papermaking chemicals such as retention aids and strengthening agents, comprising a cationic high molecular compound or an anionic high molecular compound during papermaking, aluminum hydroxide is adsorbed on fibers such as pulp to contribute to the flame resistance of paper. If the amount of aluminum hydroxide powder relative to the flame-resistant paper for radio wave absorber members is small, the flame resistance of UL94 V-0 cannot be achieved. In addition, if the amount of aluminum hydroxide powder is small, it may be unable to maintain the flame resistance corresponding to UL94 V-0 when the flame-retardant effect of the flame retardant composed of the polyborate described later has decreased after long-term use. Furthermore, the amount of the pulp in the flame-resistant paper increases, making discoloration over time conspicuous, which is not preferred. On the other hand, if the amount of aluminum hydroxide powder is large, a high flame resistance is provided, but a tensile strength sufficient for the flame-resistant paper for radio wave absorber members is not provided, which leads to tearing during fabrication into, for example, a corrugated cardboard structure, resulting in difficulty in stable manufacturing. Furthermore, the corrugated cardboard structure is not provided with a sufficient bending strength, and when fabricated into a radio wave absorber of hollow three-dimensional shape, it is more likely to be deformed or broken, for example, by contact during construction or use, which is not preferred. The amount of aluminum hydroxide powder is preferably 25 to 50% by mass. In this range, a tensile strength sufficient for fabrication can be provided, and a corrugated cardboard structure with a sufficient bending strength can be provided.

In addition, the flame-resistant paper for radio wave absorber members needs to contain the flame retardant composed of the polyborate. This is because the flame retardant composed of the polyborate has an extremely high flame-retardant effect on cellulose materials. Also, the flame retardant composed of the polyborate, for which a neutral solvent is used, importantly does not promote discoloration of the pulp, whereas phosphate and sulfamate flame retardants such as guanidine phosphate, melamine phosphate, ammonium phosphate, condensed alkyl phosphate ester derivatives, guanidine sulfamate, and ammonium sulfamate, which require an acidic solvent, promote discoloration of the pulp.

Examples of the flame retardant composed of the polyborate include sodium polyborate and calcium polyborate, and sodium polyborate is preferred in terms of the flame-retardant effect and cost. The flame retardant composed of the polyborate may be mixed with a flame retardant such as a borate or a silicate and added to the flame-resistant paper for radio wave absorber members.

It is important that the amount of the flame retardant composed of the polyborate be 3 to 15% by mass, and the amount of the flame retardant composed of the polyborate be 7 to 25% by mass relative to that of the pulp. When the amount of the flame retardant composed of the polyborate is too small, or when the amount of the flame retardant composed of the polyborate relative to that of the pulp is too small, it may be unable to achieve the desired flame resistance of UL94 V-0 and, in addition, it may be unable to maintain the flame resistance because of detachment of the flame retardant under high temperature and high humidity conditions. On the other hand, when the amount of the flame retardant composed of the polyborate is large, or when the amount of the flame retardant composed of the polyborate relative to that of the pulp is large, since the flame retardant composed of the polyborate has a property of hardening pulp, the flame-resistant paper for radio wave absorber members tends to harden to result in poor processability. For example, the flame-resistant paper for radio wave absorber members may be torn during post-processing such as processing into a corrugated cardboard and printing. In addition, the manufacturing cost of the flame-resistant paper increases, which makes its industrial application difficult. From the standpoint of sufficient flame resistance, manufacturing cost, and processability, the amount of the flame retardant composed of the polyborate is preferably 5 to 12% by mass, more preferably 5 to 9% by mass, and the amount of the flame retardant composed of the polyborate relative to that of the pulp is preferably 10 to 20% by mass.

In addition, the flame-resistant paper for radio wave absorber members preferably contains glass fibers. Since the glass fibers are inorganic fibers, they can improve flame resistance. Furthermore, since the glass fibers are highly rigid fibers, the flame-resistant paper for radio wave absorber members and a corrugated cardboard structure thereof can exhibit a higher rigidity. The amount of the glass fibers is preferably 3 to 15% by mass, more preferably 3 to 8% by mass, based on 100% by mass of the total mass of materials of the flame-resistant paper for radio wave absorber members. In this range, flame-resistant paper for radio wave absorber members having a high rigidity can be manufactured more stably, and a corrugated cardboard structure with a sufficient bending strength can be provided.

Optionally, additives such as wet strengthening agents, dry strengthening agents, retention aids, and binders, which are used in common paper materials, may be added to the flame-resistant paper for radio wave absorber members.

To further improve the flexibility of the flame-resistant paper for radio wave absorber members, it is preferable to add a flexibilizer to the flame-resistant paper for radio wave absorber members. By adding a flexibilizer to thereby provide the flame-resistant paper for radio wave absorber members with a moderate rigidity, the processability can be more excellent in that conditions can be less stringent in performing post-processing such as processing into a corrugated cardboard and printing so that the flame-resistant paper for radio wave absorber members will not be cracked or torn by a load applied when the flame-resistant paper for radio wave absorber members is folded or drawn. Examples of flexibilizers include, but are not limited to, glycerin, paraffin emulsion, quarternary ammonium salts, aliphatic alcohols, and urea. Of these, urea, which can favorably flexibilize the flame-resistant paper for radio wave absorber members by rapidly picking up moisture, is preferably used.

The amount of addition of the flexibilizer is preferably 30 to 100% by mass, more preferably 40 to 80% by mass, relative to the amount of the flame retardant composed of the polyborate. In this range, a flexibility that can sufficiently improve processability is provided without causing an increase in the amount of the flexibilizer used or decrease in properties such as flame resistance.

The flame-resistant paper for radio wave absorber members preferably has a basis weight of 50 to 200 g/m$^2$. The flame-resistant paper for radio wave absorber members is provided with an improved tensile strength, which can prevent the flame-resistant paper for radio wave absorber members from tearing when the flame-resistant paper for radio wave absorber members is fabricated into a corrugated cardboard structure. Further, the flame-resistant paper for radio wave absorber members is provided with a moderate rigidity, which can improve the processability in post-processing such as processing into a corrugated cardboard and printing. Furthermore, the basis weight is preferably 80 g/m$^2$ or more and 150 g/m$^2$ or less.

In addition, in the basis weight range above, the flame-resistant paper for radio wave absorber members preferably has a stiffness of 1 to 10 mN in both the longitudinal and transverse directions. Stiffness in this range can provide a sufficient bending strength when the flame-resistant paper for radio wave absorber members is fabricated into a corrugated cardboard structure used as a radio wave absorber member; as a result, the corrugated cardboard structure, when fabricated into a radio wave absorber of hollow three-dimensional shape, is less likely to be deformed or broken, for example, by contact during construction or use, and the flame-resistant paper for radio wave absorber members, when fabricated into a corrugated cardboard structure, has reduced cracks, allowing for stable processing even at a high speed. The stiffness of the flame-resistant paper for radio wave absorber members can be adjusted in both the longitudinal and transverse directions, for example, by adjusting the amounts of the pulp, aluminum hydroxide powder, and the flame retardant composed of the polyborate, and the amount of the flame retardant composed of the polyborate relative to that of the pulp, and adding a flexibilizer to the flame-resistant paper for radio wave absorber members. The lower limit of the stiffness of the flame-resistant paper for radio wave absorber members is more preferably 1.5 mN or more, particularly preferably 2 or more, in both the longitudinal and transverse directions to achieve a sufficient bending strength of a corrugated cardboard structure fabricated from the flame-resistant paper for radio wave absorber members, and to prevent a radio wave absorber of hollow three-dimensional shape fabricated from the corrugated cardboard structure from being deformed or broken, for example, by contact during construction or use. The upper limit of the stiffness of the flame-resistant paper for radio wave absorber members is more preferably 4 mN or less, still more preferably 3.2 mN or less, and particularly preferably 2.9 mN or less, in both the longitudinal and transverse directions to prevent the flame-resistant paper for radio wave absorber members, for example, from tearing when the flame-resistant paper for radio wave absorber members is fabricated into a corrugated cardboard structure.

When the flame-resistant paper for radio wave absorber members is processed into a corrugated cardboard, the flame-resistant paper for radio wave absorber members is subjected to a folding process while being heated. In this process, the water content in the flame-resistant paper for radio wave absorber members is reduced by the heat applied to the flame-resistant paper for radio wave absorber members. To reduce cracks at a folded part caused by carrying out the folding process in such conditions, it is recommended that the flame-resistant paper for radio wave absorber members be manufactured while adjusting, for example, the amount of the pulp contained in the flame-resistant paper for radio wave absorber members, and to increase the degree of freedom of the above conditions, the flame-resistant paper for radio wave absorber members is preferably less prone to cracking even when its water content is lower. When the flame-resistant paper for radio wave absorber members dried to have a certain low water content is placed under near-natural constant temperature and humidity conditions, the flame-resistant paper for radio wave absorber members absorbs water at a certain speed, and the water content in the flame-resistant paper for radio wave absorber members will increase as the time increases during which it is placed under near-natural constant temperature and humidity conditions. Therefore, when the flame-resistant paper for radio wave absorber members having a certain low water content is placed under near-natural constant temperature and humidity conditions, and the flame-resistant paper for radio wave absorber members is subjected to a folding process after the lapse of a certain time, it can be said that the shorter the time at which no cracks occur is, the flame-resistant paper for radio wave absorber members is less prone to cracking even at a lower water content. For the flame-resistant paper for radio wave absorber members that is less prone to cracking even at a lower water content, specifically, flame-resistant paper for radio wave absorber members is dried in a hot-air oven heated to 100° C. for 5 minutes, immediately placed in a desiccator, allowed to stand for 1 hour, and then left at rest in a room at 23° C. and 50% RH for a certain time, after which the presence of cracks at a folded part is determined in a folding process. Preferred is flame-resistant paper for radio wave absorber members that does not suffer cracking at a folded part at a certain time of 5 minutes or less, and more preferred is flame-resistant paper for radio wave absorber members that does not suffer cracking at a folded part at a certain time of 3 minutes or less.

Furthermore, in the basis weight range described above, the flame-resistant paper for radio wave absorber members preferably has a tensile strength of 4 kN/m or more, which can prevent the flame-resistant paper for radio wave absorber members from tearing during fabrication, for example, into a corrugated cardboard structure, allowing for stable processing.

The flame-resistant paper for radio wave absorber members preferably has a color difference ($\Delta E$) before and after treatment at 85° C. for 1000 hours of 4 or less. A radio wave absorber made from the flame-resistant paper for radio wave absorber members is used, for example, as a radio wave absorber used in anechoic chambers. Anechoic chambers are used for as long as 10 years or more, and it is desired that the radio wave absorber should not discolor much during this time period. Pulp in flame-resistant paper turns yellow under the stimulus such as heat and light applied during a long-time period. Furthermore, this discoloration may be promoted by adding a phosphorus-based flame retardant. In contrast, our flame-resistant paper for radio wave absorber members contains a specified amount of aluminum hydroxide powder, which does not undergo discoloration, and the flame retardant composed of the polyborate, which does not promote discoloration of pulp, and therefore hardly undergoes discoloration during long-term use. Discoloration of paper is evaluated by an accelerated test in which the paper is exposed to a high temperature environment to promote discoloration. A color difference ($\Delta E$) of 4 or less under accelerated test conditions at 85° C. for 1000 hours indicates that the discoloration during long-term use is within an allowable range. The $\Delta E$ is more preferably 3 or less.

Furthermore, the flame-resistant paper for radio wave absorber members preferably has flame resistances, as measured before and after treatment at 60° C. and 90% humidity for 1000 hours, which are both rated UL94 V-0 of UL Standards. UL is a safety standard for electronic devices established and approved by Underwriters Laboratories Inc. in the USA, and UL94 is a standard for flame resistance. Since anechoic chambers are used in various climates, a radio wave absorber may be exposed to high humidity conditions for a long period of time. Under the influence of such humidity, a flame retardant may be detached to result in a reduced flame-retardant effect. In contrast, our flame-resistant paper for radio wave absorber members, due to aluminum hydroxide powder, whose flame-retardant effect is not influenced by humidity, and a flame retardant composed of the polyborate, which can provide pulp with high flame resistance, can maintain its high flame resistance even if exposed to a high humidity environment for a long period of time. The moisture resistance of the flame-retardant effect can be evaluated by an accelerated test in a high humidity environment, for example, at 60° C. and 90% humidity for 1000 hours. When the flame resistance of UL94 V-0 is maintained after treatment under these conditions, the moisture resistance of the flame-retardant effect in a high humidity environment is within the allowable range.

Now, for the radio wave absorber member, the use of the above-described flame-resistant paper for radio wave absorber members as a corrugated medium, one or both of liners in a corrugated cardboard structure can provide a radio wave absorber member having both a sufficient bending strength and a sufficient flame resistance. Using the flame-resistant paper for radio wave absorber members as both of the corrugated medium and liners is preferred to achieve a higher flame resistance and a higher bending strength.

Furthermore, the radio wave absorber member can contain a conductive material in a corrugated medium, one or both of liners. The conductive material is a material that converts radio energy into a weak electric current, further into heat energy, to thereby attenuate radio waves, i.e., absorb radio waves. Examples of conductive materials include conductive particles such as metal particles, carbon black, carbon nanotube particles, carbon microcoil particles, and graphite particles; and conductive fibers such as carbon fibers and metal fibers such as stainless steel, copper, gold, silver, nickel, aluminum, and iron. Also, non-conductive particles or fibers provided with conductivity, for example, by plating, deposition, or thermal spraying of metal may be used. The amount of the conductive material is preferably 0.05 parts by weight to 5 parts by weight based on 100 parts by weight of materials (excluding the conductive material) of the flame-resistant paper for radio wave absorber members.

Among the conductive materials above, conductive short fibers are more preferred. The conductive fibers, which are likely to make fiber-to-fiber contact due to their high aspect ratio, can effectively provide radio wave absorbency even in a small amount compared to powder. Among the conductive fibers, carbon fibers, which themselves are rigid and easy to orient in a substrate, and undergo almost no change in properties during long-term use, are still more preferred.

Furthermore, the corrugated cardboard structure preferably has a bending strength per unit cross-sectional area of 12 N/cm$^2$ or more. In this range, the corrugated cardboard structure, when fabricated into a radio wave absorber of hollow three-dimensional shape, is less likely to be deformed or broken, for example, by contact during construction or use.

The flame-resistant paper for radio wave absorber members can be manufactured, for example, by a known paper-making process for paper materials. Examples include the wet-laid process in which fibers, aluminum hydroxide powder, and the like, which are constituent materials of the flame-resistant paper for radio wave absorber members, are mixed with water into a slurry, and paper is made using a paper machine. As the paper machine, a cylinder machine, a single cylinder machine, a Fourdrinier machine, a perch former, a Lotto former, or a Hydroformer may be used, and as a dryer, a Yankee dryer, a multicylinder dryer, or a through dryer may be used.

Furthermore, the flame retardant composed of the polyborate may be added to the flame-resistant paper for radio wave absorber members by any method. The flame retardant composed of the polyborate may be added to the flame-resistant paper for radio wave absorber members, for example, by dip application or coating application. For the dip application and the coating application, coaters such as a size press coater, a roll coater, a blade coater, a bar coater, and an air knife coater can be used, and these coaters can be used on-machine or off-machine.

Furthermore, the conductive material may be added to the flame-resistant paper for radio wave absorber members by any method, for example, by mixing the conductive material with the slurry mentioned above and incorporating the resulting mixture into the flame-resistant paper for radio wave absorber members, or mixing the conductive material with a binder resin material and applying the resulting mixture to the flame-resistant paper for radio wave absorber members using a coater such as a size press coater, a roll coater, a blade coater, a bar coater, or an air knife coater.

As a method of manufacturing the radio wave absorber member, for example, a well-known, high-speed and low-cost method of manufacturing a corrugated cardboard can be used. Specifically, a method can be used in which a medium is corrugated using an apparatus called a corrugator; the corrugated medium is pasted on either the face or back liner to manufacture a single-faced corrugated cardboard; the single-faced corrugated cardboard is pasted with another liner using the same apparatus to manufacture a double-faced or double-wall corrugated cardboard; and the double-faced or double-wall corrugated cardboard is fed to a cutter to be cut to a predetermined size. As an adhesive that bonds constituent members of the corrugated cardboard such as the corrugated medium and the liners, well-known adhesives such as starch paste can be used.

EXAMPLES

Our flame-resistant papers will now be described in detail with reference to examples. The performance data shown in the examples were measured by the methods described below.
Measurement Method
(1) Basis Weight
Base paper was cut to a 300-mm square, and from its mass, the basis weight of flame-resistant paper was calculated.
(2) Stiffness
Stiffness of flame-resistant paper in the longitudinal direction (the machine direction in wet-laying by the continuous papermaking process; the same shall apply hereinafter) and the transverse direction (the direction perpendicular to the machine direction in wet-laying by the continuous papermaking process; the same shall apply hereinafter) were measured in accordance with JIS L-1096 (1999), Bending repulsion, Method A (Gurley method). Five samples cut to a size of 51 mm in length and 25 mm in width were used for measurement.

(3) Tensile Strength
The tensile strength was measured in the longitudinal direction of flame-resistant paper in accordance with JIS P-8113 (2006).
(4) Flame Resistance
The flame resistance was evaluated based on 94 V-0 of the 20-mm vertical flame test according to the UL-94 safety standard: Tests for Flammability of Plastic Materials for Parts in Devices and Appliances. This flame resistance test was performed on flame-resistant paper before and after high humidity treatment at 60° C. and 90% humidity for 1000 hours.
Evaluation Criteria
  A: Satisfying V-0
  B: Not satisfying V-0
(5) Color Difference (ΔE) Before and After Treatment at 85° C. for 1000 Hours
The color of flame-resistant paper was measured before and after treatment at 85° C. for 1000 hours using a colorimeter, SM color computer SM-4 (manufactured by Suga Test Instruments Co., Ltd.). The measurement was made at a reflectance mode with an aperture diameter of a measuring unit being 5 mm. On the measuring unit, flame-resistant paper was placed, and a white reference plate was placed thereon. For each sample, the color was measured at ten random points, and the measurements were averaged. The color values were determined according to the L*a*b* color system described in JIS Z8730. The 10-point average color value before treatment at 85° C. for 1000 hours ($L^*_1$, $a^*_1$, $b^*_1$) and the 10-point average color value after treatment ($L^*_2$, $a^*_2$, $b^*_2$) were substituted into the following equation to determine the color difference (ΔE) therebetween.

$$\Delta E = \{(L^*_1 - L^*_2)^2 + (a^*_1 - a^*_2)^2 + (b^*_1 - b^*_2)^2\}^{0.5}$$

Figure 2:
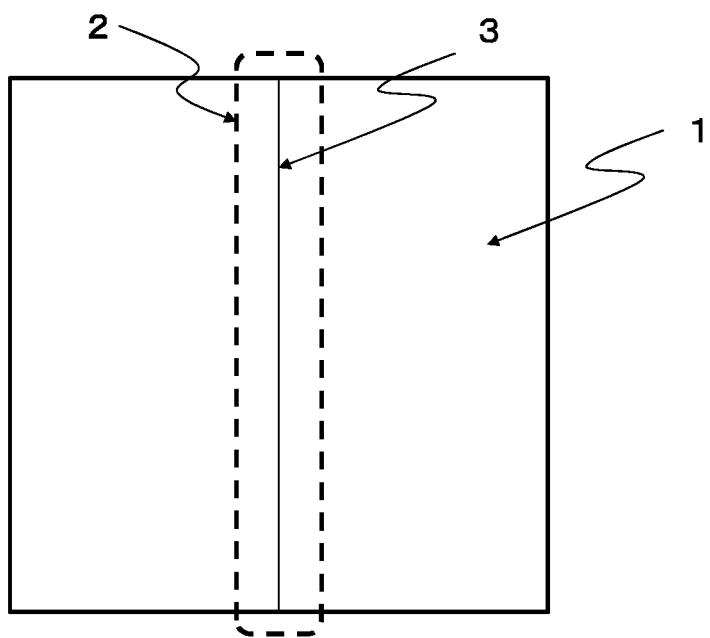
FIG. 2 is a conceptual diagram of flame-resistant paper for radio wave absorber members with no cracks at a folded part.
Figure 3:
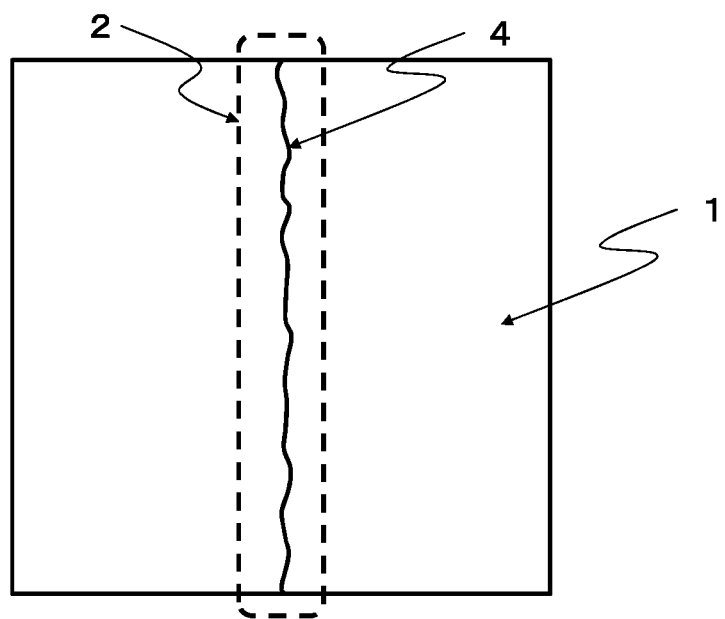
FIG. 3 is a conceptual diagram of flame-resistant paper for radio wave absorber members with a continuous crack occurred at a folded part.
Figure 4:
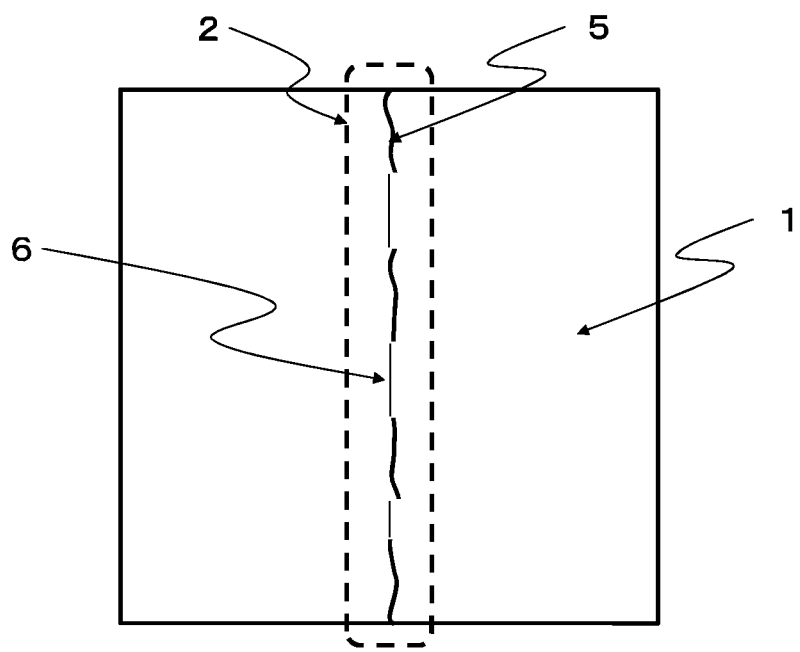
FIG. 4 is a conceptual diagram of flame-resistant paper for radio wave absorber members with discontinuous cracks occurred at a folded part.

(6) The Presence of Cracks in Flame-Resistant Paper for Radio Wave Absorber Members at Low Water Content
The presence of cracks in flame-resistant paper for radio wave absorber members was determined by the method below. Ten pieces of flame-resistant paper for radio wave absorber members cut to a 100-mm square were dried in a hot-air oven heated to 100° C. for 5 minutes, immediately placed in a desiccator, and then allowed to stand for 1 hour. Thereafter, in a room at 23° C. and 50% RH, the pieces of flame-resistant paper for radio wave absorber members were taken out of the desiccator, and from immediately after being taken out, they were subjected to a folding process shown in FIGS. 1(A)-(C) piece by piece at intervals of 1 minute. Specifically, in a room at 23° C. and 50% RH, flame-resistant paper for radio wave absorber members 1 was taken out of a desiccator and left at rest for a given time, as shown in FIG. 1(A); next, the flame-resistant paper for radio wave absorber members 1 was folded in half at or near the midpoint of long sides or short sides, and the flame-resistant paper for radio wave absorber members 1 was kept folded in half for 5 seconds, as shown in FIG. 1(B); and then the flame-resistant paper for radio wave absorber members 1 folded in half was unfolded to determine the presence of cracks at a folded part 2, as shown in FIG. 1(C). After the determination, the flame-resistant paper for radio wave absorber members was evaluated for a resting time in a room at 23° C. and 50% RH at which time the flame-resistant paper for radio wave absorber members suffered no cracking. It can be said that the shorter the resting time, the flame-resistant paper for radio wave absorber members is less prone to cracking at a lower water content. The states of cracking of the flame-resistant paper for radio wave absorber members are shown in FIGS. 2 to 4. FIG. 2 shows the flame-resistant paper for radio wave absorber members 1 having only a fold 3 but no cracks at the folded part 2; FIG.

3 shows the flame-resistant paper for radio wave absorber members 1 with a continuous crack 4 occurred at the folded part 2; and FIG. 4 shows the flame-resistant paper for radio wave absorber members 1 having discontinuous cracks 5 and discontinuous folds 6, the discontinuous cracks 5 occurring at the folded part 2. The above-described flame-resistant paper for radio wave absorber members suffering no cracking refers to flame-resistant paper for radio wave absorber members suffering neither the continuous crack 4 nor the discontinuous cracks 5 shown in FIG. 3 or FIG. 4.

(7) Bending Strength per Unit Cross-Sectional Area of Corrugated Cardboard Structure The bending strength per unit cross-sectional area of a corrugated cardboard structure was measured by the three-point bending strength test described below. For the bending strength measurement, a digital force gauge DS2-50N (manufactured by Imada Co., Ltd.), a bending test fixture GA-10N (manufactured by Imada Co., Ltd.), and a manual test stand HV-500 NII (manufactured by Imada Co., Ltd.) were used.

Figure 5:
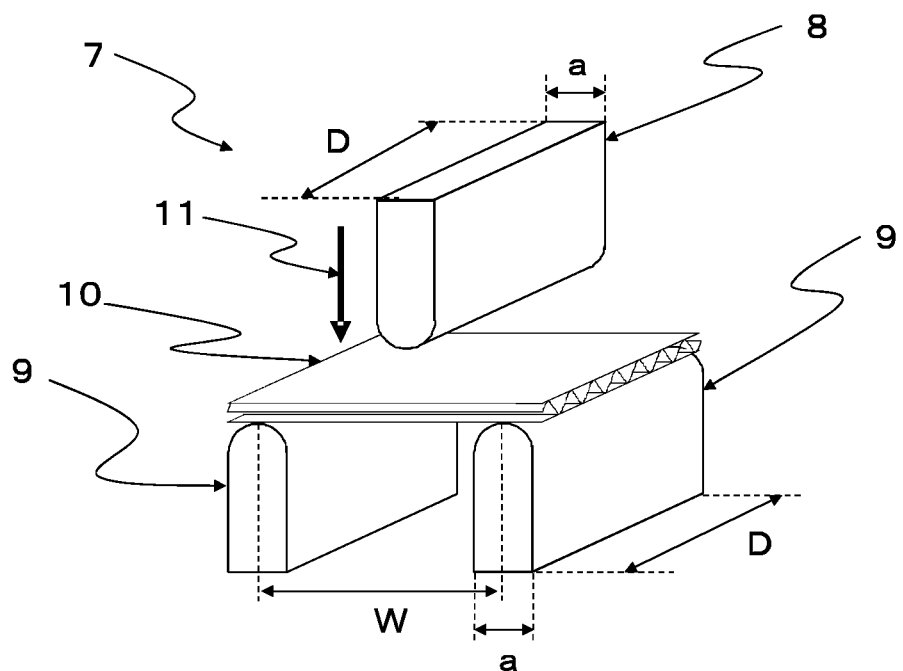
FIG. 5 is a schematic view of a fixture that measures bending strength of a corrugated cardboard structure.

FIG. 5 is a schematic view of a fixture for measuring a bending strength of a corrugated cardboard structure. A fixture 7 for measuring a bending strength of a corrugated cardboard structure was disposed as shown in FIG. 5, and a pressurizing bar 8 and supporting bars 9 with a width (a) of 5 mm and a depth (D) of 60 mm (each end of which is a semicircle with a radius of 2.5 mm) were used. The two supporting bars 9 were disposed such that the interval therebetween (W) was 40 mm, and the pressurizing bar 8 was disposed such that it was located midway between the supporting bars 9.

Next, a corrugated cardboard structure was cut to ten pieces of 50-mm square such that their sides were perpendicular or parallel to the wavy edge line of a corrugated medium to prepare test samples (corrugated cardboard structures 10).

The test sample (corrugated cardboard structure 10) was then placed on the supporting bars such that the wavy edge line of the corrugated medium and the pressurizing bar 8 were perpendicular to each other, and a pressure was applied in a pressure direction 11 via the pressurizing bar 8 to measure a maximal load (unit: N) at which the sample bent. The maximum load was divided by a unit cross-sectional area (sidelength: 50 cm×thickness: cm) to calculate a bending strength per unit cross-sectional area (unit: N/cm$^2$).

Example 1

Bleached softwood pulp with a fiber length of 5 mm in an amount of 40% by mass, aluminum hydroxide powder in an amount of 50% by mass, and glass fibers in an amount of 4% by mass were mixed and wet-laid by the continuous paper-making process. Using a size press coater, a sodium polyborate flame retardant (FIRELESS B (trade name), available from Trust Life Corporation) was applied in an amount of 6% by mass to provide flame-resistant paper for radio wave absorber members with a basis weight of 100 g/m$^2$. The sodium polyborate flame retardant was contained in an amount of 15% by mass relative to the amount of the pulp.

The flame-resistant paper for radio wave absorber members obtained was evaluated for stiffness, tensile strength, color difference (ΔE) before and after treatment at 85° C. for 1000 hours, and flame resistance before and after high humidity treatment (treatment at 60° C. and 90% humidity for 1000 hours), and the results are shown in Table 1. The stiffness was over 1 mN in both the longitudinal and transverse directions; the tensile strength was 4.4 kN/m; the ΔE was as low as 1.9; and the flame resistances before and after high humidity treatment both satisfied V-0. The flame-resistant paper for radio wave absorber members had a high tensile strength, color fastness, and a flame resistance unaffected by humidity, and also was less prone to cracking even at a very low water content.

Example 2

The same procedure as in Example 1 was repeated except that 50% by mass of the pulp and 40% by mass of aluminum hydroxide powder were used to provide flame-resistant paper for radio wave absorber members of Example 2. The sodium polyborate flame retardant was contained in an amount of 12% by mass relative to the amount of the pulp.

The flame-resistant paper for radio wave absorber members obtained was evaluated, and the results are shown in Table 1. The stiffness was over 2 mN in both the longitudinal and transverse directions due to an increased amount of the pulp; the tensile strength was 5.1 kN/m; the ΔE was 2.2; and the flame resistances before and after high humidity treatment both satisfied V-0. The flame-resistant paper for radio wave absorber members had a high tensile strength, color fastness, and a flame resistance unaffected by humidity, and also was less prone to cracking even at a very low water content.

Example 3

The same procedure as in Example 1 was repeated except that 60% by mass of the pulp and 30% by mass of aluminum hydroxide powder were used to provide flame-resistant paper for radio wave absorber members of Example 3. The sodium polyborate flame retardant was contained in an amount of 10% by mass relative to the amount of the pulp.

The evaluation results of the flame-resistant paper for radio wave absorber members obtained are shown in Table 1. The stiffness was over 2 mN in both the longitudinal and transverse directions; the tensile strength was 6.2 kN/m; the ΔE was 2.6; and the flame resistances before and after high humidity treatment both satisfied V-0. The flame-resistant paper for radio wave absorber members had a high tensile strength, color fastness, and a flame resistance unaffected by humidity, and also was less prone to cracking even at a low water content.

Example 4

The same procedure as in Example 1 was repeated except that 70% by mass of the pulp and 20% by mass of aluminum hydroxide powder were used to provide flame-resistant paper for radio wave absorber members of Example 4. The sodium polyborate flame retardant was contained in an amount of 9% by mass relative to the amount of the pulp.

The evaluation results of the flame-resistant paper for radio wave absorber members obtained are shown in Table 1. The stiffness was as high as over 4 mN in both the longitudinal and transverse directions due to a further increased amount of the pulp, and the tensile strength was as high as 6.7 kN/m. On the other hand, the ΔE was somewhat high at 3.2 due to an increased amount of the pulp which underwent discoloration. The flame resistances before and after high humidity treatment both satisfied V-0. The flame-resistant paper for radio wave absorber members had a high tensile strength, a flame resistance unaffected by humidity, and a minimum color fastness, and also was less prone to cracking even at a low water content.

Example 5

The same procedure as in Example 1 was repeated except that 50% by mass of the pulp, 36% by mass of aluminum hydroxide powder, and 10% by mass of sodium polyborate were used to provide flame-resistant paper for radio wave absorber members of Example 5. The sodium polyborate flame retardant was contained in an amount of 20% by mass relative to the amount of the pulp.

The evaluation results of the flame-resistant paper for radio wave absorber members obtained are shown in Table 1. The stiffness was over 2 mN in both the longitudinal and transverse directions; the tensile strength was 4.9 kN/m; the ΔE was as low as 2.1; and the flame resistances before and after high humidity treatment both satisfied V-0. The flame-resistant paper for radio wave absorber members had a high tensile strength, color fastness, and a flame resistance unaffected by humidity, and also was less prone to cracking even at a low water content.

Example 6

The same procedure as in Example 1 was repeated except that 60% by mass of the pulp, 26% by mass of aluminum Example 7

The same procedure as in Example 5 was repeated except that carbon fibers 3 mm in length in an amount of 1.2 parts by mass based on 100 parts by mass of the total mass of the flame-resistant paper materials (pulp, aluminum hydroxide powder, sodium polyborate flame retardant, and glass fibers) were added during wet-laying to provide flame-resistant paper for radio wave absorber members of Example 7.

The evaluation results of the flame-resistant paper for radio wave absorber members obtained are shown in Table 1. The results were the same as those of Example 5. The flame-resistant paper for radio wave absorber members had a high tensile strength, color fastness, and a flame resistance unaffected by humidity, and also was less prone to cracking even at a low water content.

TABLE 1

| | | Unit | Example 1 | Example 2 | Example 3 | Example 4 | Example 5 | Example 6 | Example 7 |
|---|---|---|---|---|---|---|---|---|---|
| Pulp | | % by mass | 40 | 50 | 60 | 70 | 50 | 60 | 50 |
| Aluminum hydroxide powder | | % by mass | 50 | 40 | 30 | 20 | 36 | 26 | 36 |
| Sodium polyborate flame retardant | | % by mass | 6 | 6 | 6 | 6 | 10 | 10 | 10 |
| Guanidine phosphate flame retardant | | % by mass | — | — | — | — | — | — | — |
| Glass fibers | | % by mass | 4 | 4 | 4 | 4 | 4 | 4 | 4 |
| Percentage of flame retardant relative to pulp | | % by mass | 15 | 12 | 10 | 9 | 20 | 17 | 20 |
| Percentage of flexibilizer (urea) relative to flame retardant | | % by mass | — | — | — | — | — | — | — |
| Conductive material | Type | Parts by mass (*1) | Not added | Not added | Not added | Not added | Not added | Not added | Carbon fibers 1.2 |
| Basis weight | | g/m² | 100 | 100 | 100 | 100 | 100 | 100 | 100 |
| Stiffness (JIS L 1096 Gurley method) | Longitudinal direction | mN | 2.1 | 3 | 3.5 | 4.7 | 2.9 | 3.4 | 2.7 |
| | Transverse direction | | 1.8 | 2.4 | 2.4 | 4.1 | 2.2 | 2 | 2.3 |
| Tensile strength (JIS P 8113) | Longitudinal direction | kN/m | 4.4 | 5.1 | 6.2 | 6.7 | 4.9 | 6.1 | 4.7 |
| Color difference (ΔE) before and after treatment at 85° C. for 1000 hours | | — | 1.9 | 2.2 | 2.6 | 3.2 | 2.1 | 2.7 | 2 |
| Flame resistance (UL94 V-0) before treatment at 60° C. and 90% humidity for 1000 hours (*2) | | — | A | A | A | A | A | A | A |
| Flame resistance (UL94 V-0) after treatment at 60° C. and 90% humidity for 1000 hours (*2) | | — | A | A | A | A | A | A | A |
| Presence of cracks in flame-resistant paper for radio wave absorber members at low water content | | min | 1 | 2 | 4 | 6 | 4 | 6 | 4 |

(*1) Amount based on 100 parts by mass of total mass of flame-resistant paper materials
(*2) Evaluation criteria for flame resistance
A: Satisfying UL-94 V-0,
B: Not satisfying UL-94 V-0 hydroxide powder, and 10% by mass of the sodium polyborate flame retardant were used to provide flame-resistant paper for radio wave absorber members of Example 6. The sodium polyborate flame retardant was contained in an amount of 17% by mass relative to the amount of the pulp.

The evaluation results of the flame-resistant paper for radio wave absorber members obtained are shown in Table 1. The stiffness was 2 mN or higher in both the longitudinal and transverse directions; the tensile strength was as high as 6.1 kN/m; the ΔE was 2.7; and the flame resistances before and after high humidity treatment both satisfied V-0. The flame-resistant paper for radio wave absorber members had a high tensile strength, color fastness, and a flame resistance unaffected by humidity, and also was less prone to cracking even at a low water content.

Example 9

The same procedure as in Example 1 was repeated except that 48% by mass of aluminum hydroxide powder and 8% by mass of sodium polyborate were used to provide flame-resistant paper for radio wave absorber members of Example 9. The sodium polyborate flame retardant was contained in an amount of 20% by mass relative to the amount of the pulp.

The evaluation results of the flame-resistant paper for radio wave absorber members obtained are shown in Table 2. The stiffness was over 1 mN in both the longitudinal and transverse directions; the tensile strength was 4.2 kN/m; the ΔE was as low as 1.8; and the flame resistances before and after high humidity treatment both satisfied V-0. The flame-resistant paper for radio wave absorber members had a high tensile strength, color fastness, and a flame resistance unaffected by humidity, and also was less prone to cracking even at a very low water content.

Example 10

The same procedure as in Example 1 was repeated except that 45% by mass of the pulp and 43% by mass of aluminum hydroxide powder (the other components being the same as in Example 9) were used to provide flame-resistant paper for radio wave absorber members of Example 10. The sodium polyborate flame retardant was contained in an amount of 18% by mass relative to the amount of the pulp.

The evaluation results of the flame-resistant paper for radio wave absorber members obtained are shown in Table 2. The stiffness was over 2 mN in both the longitudinal and transverse directions; the tensile strength was 5.0 kN/m; the ΔE was 2.0; and the flame resistances before and after high humidity treatment both satisfied V-0. The flame-resistant paper for radio wave absorber members had a high tensile strength, color fastness, and a flame resistance unaffected by humidity, and also was less prone to cracking even at a very low water content.

Example 11

The same procedure as in Example 1 was repeated except that 50% by mass of the pulp and 38% by mass of aluminum hydroxide powder (the other components being the same as in Example 9) were used to provide flame-resistant paper for radio wave absorber members of Example 11. The sodium polyborate flame retardant was contained in an amount of 16% by mass relative to the amount of the pulp.

The evaluation results of the flame-resistant paper for radio wave absorber members obtained are shown in Table 2. The stiffness was over 2 mN in both the longitudinal and transverse directions; the tensile strength was 5.3 kN/m; the ΔE was 2.2; and the flame resistances before and after high humidity treatment both satisfied V-0. The flame-resistant paper for radio wave absorber members had a high tensile strength, color fastness, and a flame resistance unaffected by humidity, and also was less prone to cracking even at a very low water content.

Example 12

The same procedure as in Example 1 was repeated except that 55% by mass of the pulp and 33% by mass of aluminum hydroxide powder (the other components being the same as in Example 9) were used to provide flame-resistant paper for radio wave absorber members of Example 12. The sodium polyborate flame retardant was contained in an amount of 15% by mass relative to the amount of the pulp.

The evaluation results of the flame-resistant paper for radio wave absorber members obtained are shown in Table 2. The stiffness was over 2 mN in both the longitudinal and transverse directions, and a high tensile strength of 5.8 kN/m was provided. Furthermore, the ΔE was 2.5, and the flame resistances before and after high humidity treatment both satisfied V-0. The flame-resistant paper for radio wave absorber members had a high tensile strength, color fastness, and a flame resistance unaffected by humidity, and also was less prone to cracking even at a very low water content.

Example 13

The same procedure as in Example 1 was repeated except that 60% by mass of the pulp and 28% by mass of aluminum hydroxide powder (the other components being the same as in Example 9) were used to provide flame-resistant paper for radio wave absorber members of Example 13. The sodium polyborate flame retardant was contained in an amount of 13% by mass relative to the amount of the pulp.

The evaluation results of the flame-resistant paper for radio wave absorber members obtained are shown in Table 2. The stiffness was 3 mN or higher in both the longitudinal and transverse directions, and a high tensile strength of 5.8 kN/m was provided. Furthermore, the ΔE was 2.7, and the flame resistances before and after high humidity treatment both satisfied V-0. The flame-resistant paper for radio wave absorber members had a high tensile strength, color fastness, and a flame resistance unaffected by humidity, and also was less prone to cracking even at a low water content.

Example 14

The same procedure as in Example 11 was repeated except that carbon fibers 3 mm in length in an amount of 1.2 parts by mass based on 100 parts by mass of the total mass of the flame-resistant paper for radio wave absorber members (pulp, aluminum hydroxide powder, sodium polyborate flame retardant, and glass fibers) were added during wet-laying to provide flame-resistant paper for radio wave absorber members of Example 14.

The evaluation results of the flame-resistant paper for radio wave absorber members obtained are shown in Table 2. The results were the same as those of Example 11. The flame-resistant paper for radio wave absorber members had a high tensile strength, color fastness, and a flame resistance unaffected by humidity, and also was less prone to cracking even at a very low water content.

TABLE 2

|  |  | Unit | Example 9 | Example 10 | Example 11 | Example 12 | Example 13 | Example 14 |
|---|---|---|---|---|---|---|---|---|
| Pulp |  | % by mass | 40 | 45 | 50 | 55 | 60 | 50 |
| Aluminum hydroxide powder |  | % by mass | 48 | 43 | 38 | 33 | 28 | 38 |
| Sodium polyborate flame retardant |  | % by mass | 8 | 8 | 8 | 8 | 8 | 8 |
| Guanidine phosphate flame retardant |  | % by mass | — | — | — | — | — | — |
| Glass fibers |  | % by mass | 4 | 4 | 4 | 4 | 4 | 4 |
| Percentage of flame retardant relative to pulp |  | % by mass | 20 | 18 | 16 | 15 | 13 | 16 |
| Percentage of flexibilizer (urea) relative to flame retardant |  | % by mass | — | — | — | — | — | — |
| Basis weight |  | g/m² | 100 | 100 | 100 | 100 | 100 | 100 |
| Stiffness | Longitudinal direction | mN | 2.2 | 3.2 | 3.5 | 3.7 | 3.7 | 3.2 |
| (JIS L 1096 Gurley method) | Transverse direction |  | 1.8 | 2.5 | 2.5 | 2.7 | 3 | 2.6 |
| Tensile strength (JIS P 8113) | Longitudinal direction | kN/m | 4.2 | 5 | 5.3 | 5.8 | 5.8 | 5 |
| Color difference (ΔE) before and after treatment at 85° C. for 1000 hours |  | — | 1.8 | 2 | 2.2 | 2.5 | 2.6 | 2 |

TABLE 2-continued

|  | Unit | Example 9 | Example 10 | Example 11 | Example 12 | Example 13 | Example 14 |
|---|---|---|---|---|---|---|---|
| Flame resistance (UL94 V-0) before treatment at 60° C. and 90% humidity for 1000 hours (*2) | — | A | A | A | A | A | A |
| Flame resistance (UL94 V-0) after treatment at 60° C. and 90% humidity for 1000 hours (*2) | — | A | A | A | A | A | A |
| Presence of cracks in flame-resistant paper for radio wave absorber members at low water content | min | 2 | 2 | 2 | 3 | 5 | 2 |

*1 Amount based on 100 parts by mass of total mass of flame-resistant paper materials
(*2) Evaluation criteria for flame resistance
A: Satisfying UL-94 V-0,
B: Not satisfying UL-94 V-0

Example 15

The same procedure as in Example 6 was repeated except that when the sodium polyborate flame retardant was applied to the paper material using a size press coater, urea (reagent grade urea, available from Takasugi Pharmaceutical Co., Ltd.) was added into a working solution of the sodium polyborate flame retardant to provide flame-resistant paper for radio wave absorber members of Example 15. The urea was added in an amount of 35% by mass relative to the amount of the sodium polyborate flame retardant.

The evaluation results of the flame-resistant paper for radio wave absorber members obtained are shown in Table 3. The stiffness was 2 mN or higher in both the longitudinal and transverse directions; the tensile strength was as high as 5.9 kN/m; the ΔE was 2.5; and the flame resistances before and after high humidity treatment both satisfied V-0. The flame-resistant paper for radio wave absorber members had a high tensile strength, color fastness, and a flame resistance unaffected by humidity. The addition of urea provided the flame-resistant paper for radio wave absorber members with more appropriate stiffness, and flame-resistant paper for radio wave absorber members less prone to cracking even at a very low water content could be obtained.

Example 16

The same procedure as in Example 15 was repeated except that the amount of urea relative to that of the sodium polyborate flame retardant was 50% to provide flame-resistant paper for radio wave absorber members of Example 16.

The evaluation results of the flame-resistant paper for radio wave absorber members obtained are shown in Table 3. The stiffness was 2 mN or higher in both the longitudinal and transverse directions, and a very high tensile strength of 6.3 kN/m was provided. Furthermore, the ΔE was 2.7, and the flame resistances before and after high humidity treatment both satisfied V-0. The flame-resistant paper for radio wave absorber members had a high tensile strength, color fastness, and a flame resistance unaffected by humidity, and also was less prone to cracking even at a very low water content.

Example 17

The same procedure as in Example 15 was repeated except that the amount of urea relative to that of the sodium polyborate flame retardant was 85% to provide flame-resistant paper for radio wave absorber members of Example 16.

The evaluation results of the flame-resistant paper for radio wave absorber members obtained are shown in Table 3. The stiffness was 2 mN or higher in both the longitudinal and transverse directions, and a very high tensile strength of 6.3 kN/m was provided. Furthermore, the ΔE was 2.6, and the flame resistances before and after high humidity treatment both satisfied V-0. The flame-resistant paper for radio wave absorber members had a high tensile strength, color fastness, and a flame resistance unaffected by humidity, and also was less prone to cracking even at a very low water content.

TABLE 3

|  |  | Unit | Example 15 | Example 16 | Example 17 |
|---|---|---|---|---|---|
| Pulp |  | % by mass | 60 | 60 | 60 |
| Aluminum hydroxide powder |  | % by mass | 26 | 26 | 26 |
| Sodium polyborate flame retardant |  | % by mass | 10 | 10 | 10 |
| Guanidine phosphate flame retardant |  | % by mass | — | — | — |
| Glass fibers |  | % by mass | 4 | 4 | 4 |
| Percentage of flame retardant relative to pulp |  | % by mass | 17 | 17 | 17 |
| Percentage of flexibilizer (urea) relative to flame retardant |  | % by mass | 35 | 50 | 85 |
| Conductive material | Type | Parts by mass (*1) | Not added | Not added | Not added |
| Basis weight |  | g/m$^2$ | 100 | 100 | 100 |
| Stiffness | Longitudinal direction | mN | 3.2 | 2.9 | 2.5 |
| (JIS L 1096 Gurley method) | Transverse direction |  | 2 | 1.9 | 1.9 |
| Tensile strength (JIS P 8113) | Longitudinal direction | kN/m | 5.9 | 6.3 | 6.3 |
| Color difference (ΔE) before and after treatment at 85° C. for 1000 hours |  | — | 2.5 | 2.7 | 2.6 |
| Flame resistance (UL94 V-0) before treatment at 60° C. and 90% humidity for 1000 hours (*2) |  | — | A | A | A |
| Flame resistance (UL94 V-0) after treatment at 60° C. and 90% humidity for 1000 hours (*2) |  | — | A | A | A |

TABLE 3-continued

| | Unit | Example 15 | Example 16 | Example 17 |
|---|---|---|---|---|
| Presence of cracks in flame-resistant paper for radio wave absorber members at low water content | min | 2 | 1 | 1 |

(*1) Amount based on 100 parts by mass of total mass of flame-resistant paper materials
(*2) Evaluation criteria for flame resistance
A: Satisfying UL-94 V-0,
B: Not satisfying UL-94 V-0

Comparative Example 1

The same procedure as in Example 5 was repeated except that the sodium polyborate flame retardant was replaced with a guanidine phosphate flame retardant (Product name: Nonnen (registered trademark) 985, available from Marubishi Oil Chemical Co., Ltd.) to provide flame-resistant paper for radio wave absorber members of Comparative Example 1. The guanidine phosphate flame retardant was contained in an amount of 20% by mass relative to the amount of the pulp.

The flame-resistant paper for radio wave absorber members obtained was evaluated in the same manner as in Example 1, and the results are shown in Table 4. For stiffness and tensile strength, the results were the same as those of Example 5. In addition, the flame-resistant paper for radio wave absorber members was less prone to cracking even at a very low water content. However, the ΔE was 17.5 indicating significant discoloration and, furthermore, although the flame resistance before high humidity treatment satisfied V-0, the flame resistance after high humidity treatment did not satisfy V-0; the flame-resistant paper for radio wave absorber members was poor in color fastness and moisture resistance of the flame-retardant effect.

Comparative Example 2

The same procedure as in Example 1 was repeated except that 30% by mass of the pulp, 56% by mass of aluminum hydroxide powder, and 10% by mass of the sodium polyborate flame retardant were used to provide flame-resistant paper for radio wave absorber members of Comparative Example 2. The sodium polyborate flame retardant was contained in an amount of 33% by mass relative to the amount of the pulp.

The evaluation results of the flame-resistant paper for radio wave absorber members obtained are shown in Table 4. The stiffness was below 1 mN due to a decreased amount of the pulp, and the tensile strength was as low as 2.6 kN/m. On the other hand, due to an increased amount of aluminum hydroxide powder, which does not undergo discoloration and has a flame resistance that is not reduced by humidity, the ΔE was as low as 1.4, and the flame resistances before and after high humidity treatment both satisfied V-0. In addition, the flame-resistant paper for radio wave absorber members was less prone to cracking even at a very low water content. Thus, the flame-resistant paper for radio wave absorber members was excellent in color fastness and moisture resistance of the flame-retardant effect but poor in tensile strength.

Comparative Example 3

The same procedure as in Example 1 was repeated except that 80% by mass of the pulp, 6% by mass of aluminum hydroxide powder, and 10% by mass of the sodium polyborate flame retardant were used to provide flame-resistant paper for radio wave absorber members of Comparative Example 3. The sodium polyborate flame retardant was contained in an amount of 13% by mass relative to the amount of the pulp.

The evaluation results of the flame-resistant paper for radio wave absorber members obtained are shown in Table 4. Due to an increased amount of the pulp, the stiffness was over 4, and the tensile strength was as high as 7.9 kN/m. On the other hand, the ΔE was somewhat high at 3.8, and a sufficient flame resistance was not provided, such that V-0 was not satisfied either before or after high humidity treatment. Thus, the flame-resistant paper for radio wave absorber members was excellent in tensile strength but poor in color fastness and flame resistance, and also was prone to cracking at a low water content.

Comparative Example 4

The same procedure as in Example 1 was repeated except that 50% by mass of the pulp, 44.5% by mass of aluminum hydroxide powder, and 1.5% by mass of the sodium polyborate flame retardant were used to provide flame-resistant paper for radio wave absorber members of Comparative Example 4. The sodium polyborate flame retardant was contained in an amount of 3% by mass relative to the amount of the pulp.

The evaluation results of the flame-resistant paper for radio wave absorber members obtained are shown in Table 4. Although the stiffness, the tensile strength, and the ΔE were substantially comparable to those of Example 5, a sufficient flame resistance was not provided, such that V-0 was not satisfied either before or after high humidity treatment.

Comparative Example 5

The same procedure as in Comparative Example 2 was repeated except that carbon fibers 3 mm in length in an amount of 1.2 parts by mass based on 100 parts by mass of the total mass of the flame-resistant paper materials (pulp, aluminum hydroxide powder, sodium polyborate flame retardant, and glass fibers) were added during wet-laying to provide flame-resistant paper for radio wave absorber members of Comparative Example 5.

The evaluation results of the flame-resistant paper for radio wave absorber members obtained are shown in Table 4. Similarly to Comparative Example 2, the flame-resistant paper for radio wave absorber members had color fastness and moisture resistance of the flame-retardant effect but was poor in tensile strength.

TABLE 4

|  | Unit | Comparative Example 1 | Comparative Example 2 | Comparative Example 3 | Comparative Example 4 | Comparative Example 5 |
|---|---|---|---|---|---|---|
| Pulp | % by mass | 50 | 30 | 80 | 50 | 30 |
| Aluminum hydroxide powder | % by mass | 36 | 56 | 6 | 44.5 | 56 |
| Sodium polyborate flame retardant | % by mass | — | 10 | 10 | 1.5 | 10 |
| Guanidine phosphate flame retardant | % by mass | 10 | — | — | — | — |
| Glass fibers | % by mass | 4 | 4 | 4 | 4 | 4 |
| Percentage of flame retardant relative to pulp |  | 20% | 33% | 13% | 3% | 33% |
| Percentage of flexibilizer (urea) relative to flame retardant |  | — | — | — | — | — |
| Conductive material         Type | Parts by mass (*1) | Not added | Not added | Not added | Not added | Carbon fibers  1.2 |
| Basis weight | g/m² | 100 | 100 | 100 | 100 | 100 |
| Stiffness                  Longitudinal direction | mN | 2.5 | 0.9 | 5.8 | 2.7 | 1.4 |
| (JIS L 1096 Gurley method) Transverse direction |  | 2 | 0.9 | 4.8 | 2.3 | 1.3 |
| Tensile strength (JIS P 8113) Longitudinal direction | kN/m | 5 | 2.6 | 7.9 | 5.4 | 2.2 |
| Color difference (ΔE) before and after treatment at 85° C. for 1000 hours | — | 17.5 | 1.4 | 3.8 | 1.8 | 1.5 |
| Flame resistance (UL94 V-0) before treatment at 60° C. and 90% humidity for 1000 hours (*2) | — | A | A | B | B | A |
| Flame resistance (UL94 V-0) after treatment at 60° C. and 90% humidity for 1000 hours (*2) | — | B | A | B | B | A |
| Presence of cracks in flame-resistant paper for radio wave absorber members at low water content | min | 1 | 1 | 9 | 1 | 1 |

(*1) Amount based on 100 parts by mass of total mass of flame-resistant paper materials
(*2) Evaluation criteria for flame resistance
A: Satisfying UL-94 V-0,
B: Not satisfying UL-94 V-0

Example 8

Using the flame-resistant paper for radio wave absorber members of Example 5 as base paper for face and back liners and the flame-resistant paper for radio wave absorber members of Example 7 as base paper for a corrugated medium, a B flute (thickness: 0.25 cm, take up ratio: 1.35) corrugated cardboard structure was fabricated with a corrugator to provide a radio wave absorber member.

The bending strength per unit cross-sectional area of the radio wave absorbing member obtained was measured to be as high as 18.4 N/cm² as shown in Table 5.

Example 18

The same procedure as in Example 8 was repeated except using the flame-resistant paper for radio wave absorber members of Example 11 as base paper for face and back liners and the flame-resistant paper for radio wave absorber members of Example 14 as base paper for a corrugated medium to provide a radio wave absorber member of Comparative Example 6.

The bending strength per unit cross-sectional area of the radio wave absorbing member obtained was measured to be as high as 18.1 N/cm² as shown in Table 5.

Comparative Example 6

The same procedure as in Example 8 was repeated except using the flame-resistant paper for radio wave absorber members of Comparative Example 2 as base paper for face and back liners and the flame-resistant paper for radio wave absorber members of Comparative Example 5 as base paper for a corrugated medium to provide a radio wave absorber member of Comparative Example 6.

The bending strength per unit cross-sectional area of the radio wave absorbing member obtained was measured to be as low as 6.4 N/cm² as shown in Table 5. The radio wave absorbing member was poor in rigidity.

TABLE 5

|  | Example 8 | Example 18 | Comparative Example 6 |
|---|---|---|---|
| Face liner base paper | Example 5 | Example 11 | Comparative Example 2 |
| Corrugated medium base paper | Example 7 | Example 14 | Comparative Example 5 |
| Back liner base paper | Example 5 | Example 11 | Comparative Example 2 |
| Type of corrugation | B flute | B flute | B flute |
| Bending strength (N) per unit cross-sectional area | 18.4 | 18.1 | 6.4 |

It can be seen from the results of Examples 1 to 18 and Comparative Examples 1 to 6 described above that our flame-resistant paper for radio wave absorber members, which comprises pulp, aluminum hydroxide powder, and a flame retardant composed of the polyborate each in a predetermined amount, has a high tensile strength, a moderate rigidity, and a high flame resistance, and is excellent in color fastness and moisture resistance of the flame-retardant effect. It can also be seen that our flame-resistant paper for radio wave absorber members is less prone to cracking even at a low water content.

INDUSTRIAL APPLICABILITY

The flame-resistant paper for radio wave absorber members can be used as a member that constitutes an anechoic chamber absorber or a radio wave absorber to improve the radio wave environment in various wireless communication systems such as an ETC system, a wireless LAN system, and a RFID system, and particularly as a member of an anechoic chamber absorber having a hollow three-dimensional shape, which is an often-used form of a radio wave absorber for anechoic chambers.

The invention claimed is:
1. Flame-resistant paper for radio wave absorber members, comprising:
   40 to 70% by mass of pulp;
   5 to 50% by mass of aluminum hydroxide powder; and

3 to 15% by mass of a flame retardant consisting of a polyborate, wherein the flame retardant consisting of a polyborate is contained in an amount of 7 to 25% by mass relative to the amount of the pulp.

2. The flame-resistant paper according to claim 1, having a basis weight in the range of 50 to 200 g/m² and stiffness in the range of 1 to 10 mN in both the longitudinal direction and the transverse direction.

3. The flame-resistant paper according to claim 1, having flame resistances, as measured before and after treatment at 60° C. and 90% humidity for 1000 hours, that are rated UL94 V-0 of UL Standards.

4. The flame-resistant paper according to claim 2, having flame resistances, as measured before and after treatment at 60° C. and 90% humidity for 1000 hours, that are rated UL94 V-0 of UL Standards.

5. The flame-resistant paper according to claim 1, having a color difference (ΔE) before and after treatment at 85° C. for 1000 hours of 4 or less.

6. The flame-resistant paper according to claim 2, having a color difference (ΔE) before and after treatment at 85° C. for 1000 hours of 4 or less.

7. The flame-resistant paper according to claim 3, having a color difference (ΔE) before and after treatment at 85° C. for 1000 hours of 4 or less.

8. The flame-resistant paper according to claim 4, having a color difference (ΔE) before and after treatment at 85° C. for 1000 hours of 4 or less.

9. A radio wave absorber member, which is a corrugated cardboard structure comprising the flame-resistant paper according to claim 1 as a corrugated medium or corrugated liners, wherein at least one of the corrugated medium and the liners contain a conductive material, and the corrugated cardboard structure has a bending strength per unit cross-sectional area of 12 N/cm² or more.

10. A radio wave absorber member, which is a corrugated cardboard structure comprising the flame-resistant paper according to claim 2 as a corrugated medium or corrugated liners, wherein at least one of the corrugated medium and the liners contain a conductive material, and the corrugated cardboard structure has a bending strength per unit cross-sectional area of 12 N/cm² or more.

11. A radio wave absorber member, which is a corrugated cardboard structure comprising the flame-resistant paper according to claim 3 as a corrugated medium or corrugated liners, wherein at least one of the corrugated medium and the liners contain a conductive material, and the corrugated cardboard structure has a bending strength per unit cross-sectional area of 12 N/cm² or more.

12. A radio wave absorber member, which is a corrugated cardboard structure comprising the flame-resistant paper according to claim 4 as a corrugated medium or corrugated liners, wherein at least one of the corrugated medium and the liners contain a conductive material, and the corrugated cardboard structure has a bending strength per unit cross-sectional area of 12 N/cm² or more.

13. A radio wave absorber member, which is a corrugated cardboard structure comprising the flame-resistant paper according to claim 5 as a corrugated medium or corrugated liners, wherein at least one of the corrugated medium and the liners contain a conductive material, and the corrugated cardboard structure has a bending strength per unit cross-sectional area of 12 N/cm² or more.

14. A radio wave absorber member, which is a corrugated cardboard structure comprising the flame-resistant paper according to claim 6 as a corrugated medium or corrugated liners, wherein at least one of the corrugated medium and the liners contain a conductive material, and the corrugated cardboard structure has a bending strength per unit cross-sectional area of 12 N/cm² or more.

15. A radio wave absorber member, which is a corrugated cardboard structure comprising the flame-resistant paper according to claim 7 as a corrugated medium or corrugated liners, wherein at least one of the corrugated medium and the liners contain a conductive material, and the corrugated cardboard structure has a bending strength per unit cross-sectional area of 12 N/cm² or more.

16. A radio wave absorber member, which is a corrugated cardboard structure comprising the flame-resistant paper according to claim 8 as a corrugated medium or corrugated liners, wherein at least one of the corrugated medium and the liners contain a conductive material, and the corrugated cardboard structure has a bending strength per unit cross-sectional area of 12 N/cm² or more.

* * * * *